US012598678B2

(12) United States Patent　　　　　(10) Patent No.:　　US 12,598,678 B2
Miura et al.　　　　　　　　　　　　　　(45) Date of Patent:　　　　Apr. 7, 2026

(54) DISPLAY DEVICE AND ELECTRONIC APPARATUS

(71) Applicant: SONY SEMICONDUCTOR SOLUTIONS CORPORATION, Kanagawa (JP)

(72) Inventors: Kiwamu Miura, Kanagawa (JP); Kouhei Sugiyama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 612 days.

(21) Appl. No.: 17/905,848

(22) PCT Filed: Mar. 19, 2021

(86) PCT No.: PCT/JP2021/011387
　§ 371 (c)(1),
　(2) Date: Sep. 8, 2022

(87) PCT Pub. No.: WO2021/187618
　PCT Pub. Date: Sep. 23, 2021

(65) Prior Publication Data
　US 2023/0122790 A1　　Apr. 20, 2023

(30) Foreign Application Priority Data

Mar. 19, 2020　(JP) ................................. 2020-049922

(51) Int. Cl.
　*H05B 33/22*　　　(2006.01)
　*H10K 50/852*　　(2023.01)
　*H10K 59/80*　　　(2023.01)

(52) U.S. Cl.
　CPC ........... *H05B 33/22* (2013.01); *H10K 50/852* (2023.02); *H10K 59/8792* (2023.02)

(58) Field of Classification Search
　CPC .... H05B 33/22; H10K 50/852; H10K 50/865; H10K 59/12; H10K 59/8792;
　　　　　　(Continued)

(56) References Cited

U.S. PATENT DOCUMENTS

2013/0154949 A1* 6/2013 Jamshidi Roudbari ......................
　　　　　　　　　　　　　　　　　　　　G06F 3/0412
　　　　　　　　　　　　　　　　　　　　349/110
2014/0078415 A1* 3/2014 Tanabe .............. G02F 1/133308
　　　　　　　　　　　　　　　　　　　　349/12

(Continued)

FOREIGN PATENT DOCUMENTS

CN　　107357092 A　　11/2017
CN　　110007527 A　　7/2019
　　　　　　(Continued)

OTHER PUBLICATIONS

International Search Report and Written Opinion of PCT Application No. PCT/JP2021/011387, issued on May 18, 2021, 12 pages of ISRWO.

*Primary Examiner* — Shahed Ahmed
(74) *Attorney, Agent, or Firm* — CHIP LAW GROUP

(57)　　　　　　ABSTRACT

There is provided a display device which includes a metal layer provided outside an effective display region, an electrode that extends outward from the effective display region, and a filter-layered body provided facing the metal layer. The filter-layered body includes a first color filter and a second color filter having a hole.

11 Claims, 5 Drawing Sheets

(58) Field of Classification Search
   CPC ....... H10K 50/00–88; H10K 59/00–95; H10K
                   71/00–861; H10K 2102/00–361; G02B
                                                              5/208
   See application file for complete search history.

(56)                    References Cited

U.S. PATENT DOCUMENTS

| 2016/0301932 | A1* | 10/2016 | Kurokawa | ............. H04N 19/42 |
| 2018/0149910 | A1 | 5/2018 | Wang | |
| 2022/0199694 | A1* | 6/2022 | Bae | .................... H10K 59/8792 |

FOREIGN PATENT DOCUMENTS

| CN | 209388085 | U | 9/2019 |
| JP | 2008-033193 | A | 2/2008 |
| JP | 2012-069256 | A | 4/2012 |
| JP | 2014-056223 | A | 3/2014 |
| WO | 2020/189407 | A1 | 9/2020 |

* cited by examiner

313

310

311

312

315

310

311

314

DISPLAY DEVICE AND ELECTRONIC APPARATUS

CROSS REFERENCE TO RELATED APPLICATIONS

This application is a U.S. National Phase of International Patent Application No. PCT/JP2021/011387 filed on Mar. 19, 2021, which claims priority benefit of Japanese Patent Application No. JP 2020-049922 filed in the Japan Patent Office on Mar. 19, 2020. Each of the above-referenced applications is hereby incorporated herein by reference in its entirety.

TECHNICAL FIELD

The present disclosure relates to a display device and an electronic apparatus including the display device.

BACKGROUND ART

In recent years, an organic electroluminescence (hereinafter referred to as "EL") display device including a plurality of organic EL elements using electroluminescence as an organic material is used in various electronic apparatuses. In the organic EL display device, a value of current flowing through the organic EL elements is controlled to acquire the gray scale in color of emission. Further, among such organic EL display devices, in an active-matrix display device, a pixel circuit including a transistor and a capacitive element is provided for each pixel and the pixel circuit drives the corresponding organic EL element. For this reason, for example, various pixel circuits have been proposed as pixel circuits for organic EL elements that correct variations in drive transistors (see, for example, Patent Document 1).

CITATION LIST

Patent Document

Patent Document 1: Japanese Patent Application Laid-Open No. 2008-33193

SUMMARY OF THE INVENTION

Problems to be Solved by the Invention

An organic EL display device has an effective display region and its peripheral region (hereinafter referred to as "peripheral region") in which a metal layer used for wiring and a metal layer (cathode contact portion) for making contact with the cathode electrode are disposed. Thus, there is an issue that visual recognition deteriorates due to reflection of external light by such a metal layer. In order to suppress such deterioration in visual recognition, it is conceivable to suppress reflection of external light by providing a light-blocking material in the peripheral region. However, the provision of the light-blocking material in the peripheral region results in blocking of ultraviolet light by the light-blocking material. Thus, it is difficult to allow a sufficient amount of ultraviolet light to reach a filler in the peripheral region in the manufacturing process of the display device. This may have an issue in that a display defect occurs due to the insufficiently cured filler, resulting in a decrease in reliability.

An object of the present disclosure is to provide a display device capable of suppressing reflection of external light outside an effective display region and suppressing a decrease in reliability, and an electronic apparatus including the display device.

Solutions to Problems

In order to solve the above problems, according to a first disclosure, a display device includes:

a metal layer provided outside an effective display region; and a filter-layered body provided facing the metal layer, in which the filter-layered body includes a first color filter and a second color filter having a hole.

According to a second disclosure, an electronic apparatus includes: the display device according to the first disclosure.

MODE FOR CARRYING OUT THE INVENTION

An embodiment of the present disclosure will be described in the following order.

1 Configuration of Display Device
2 Method for Manufacturing Display Device
3 Actions and Effects
4 Modified Examples
5 Applications

1 Configuration of Display Device

Figure 1A:
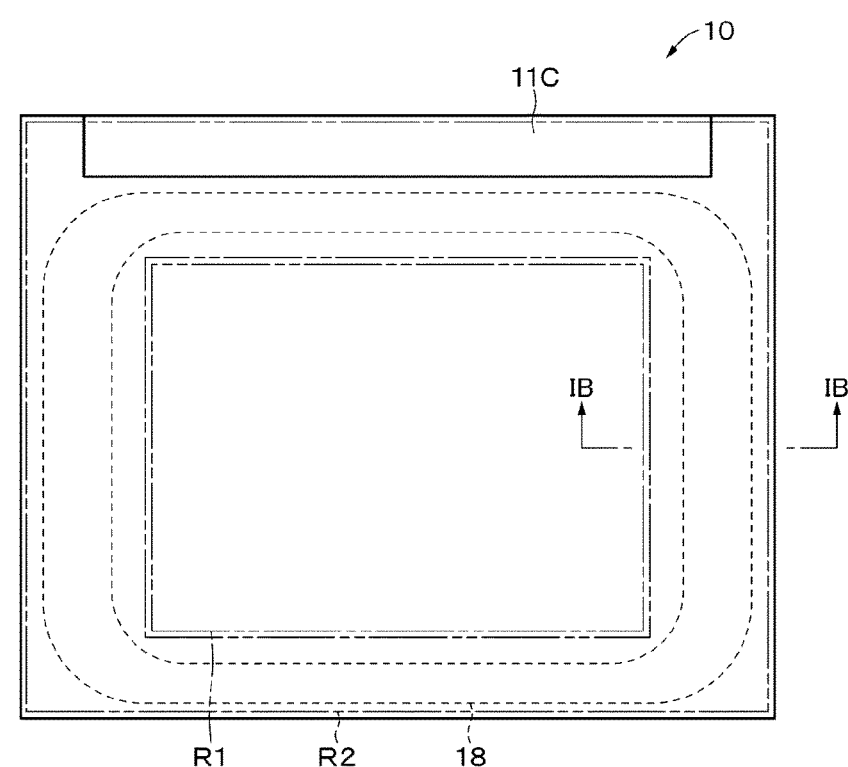
FIG. 1A is a plan view illustrating an exemplary configuration of a display device according to an embodiment of the present disclosure.
Figure 1B:
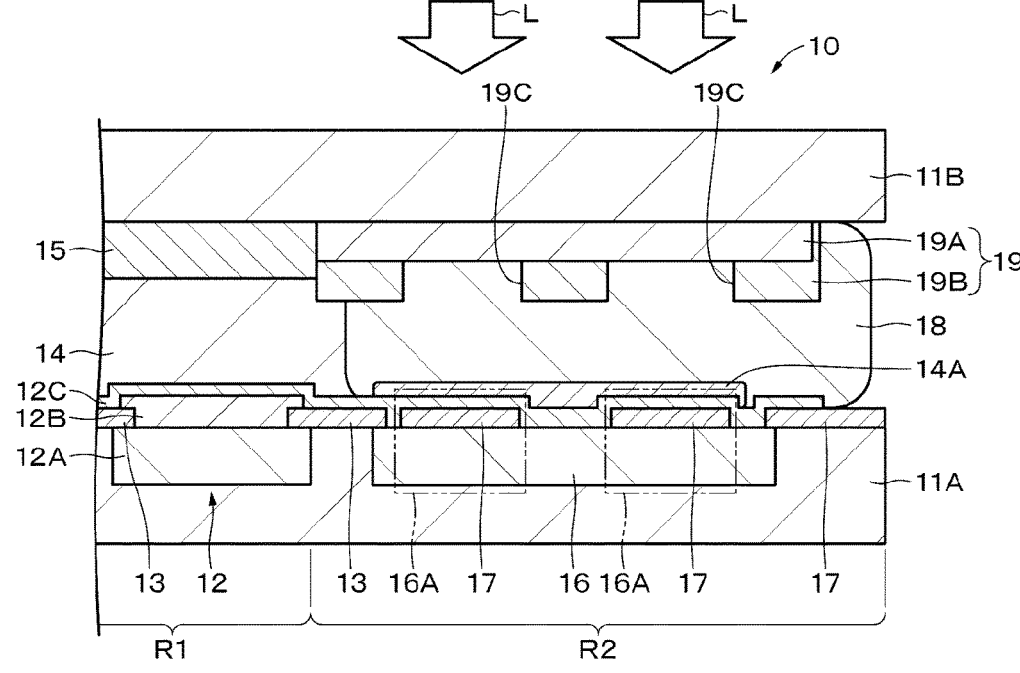
FIG. 1B is a sectional view taken along line IB-IB in FIG. 1A.

FIG. 1A is a plan view illustrating an exemplary configuration of a display device 10 according to an embodiment of the present disclosure. FIG. 1B is a sectional view taken along line IB-IB in FIG. 1A. The display device 10 has an effective display region R1 and a peripheral region R2.

The display device 10 is a top-emission display device. The display device 10 includes a substrate 11A and a counter substrate 11B facing the substrate 11A. The counter substrate 11B side is the top side, and the substrate 11A side is the bottom side. The display device 10 includes a plurality of light emitting elements 12, an insulating layer (first insulating layer) 13, a protective layer 14, and a color filter 15 between the substrate 11A and the counter substrate 11B in the effective display region R1.

The display device 10 includes a contact portion (metal layer) 16, an optical adjustment layer (second insulating layer) 17, a second electrode 12C, a filler 14A, a sealant 18, and a filter-layered body 19 between the substrate 11A and the counter substrate 11B in the peripheral region R2. The second electrode 12C and the contact portion 16 are included in a resonator structure 16A. The display device 10 may include a pad portion 11C in the peripheral region R2.

The display device 10 is, for example, a microdisplay with self-luminous elements formed in an array, such as an OLED, a Micro-OLED, or a Micro-LED. The display device 10 is suitable for use in various electronic apparatuses. The display device 10 is suitable for use in a display device for virtual reality (VR), mixed reality (MR), or augmented reality (AR); an electronic view finder (EVF); a small projector; and others.

(Substrate 11)

The substrate 11 is a supporting body that supports the plurality of light emitting elements 12 arranged on one main face of the substrate 11. In addition, although not illustrated, the substrate 11 may be provided with a drive circuit including a sampling transistor and a driving transistor for controlling driving of the plurality of light emitting elements 12, and a power supply circuit for supplying power to the plurality of light emitting elements 12.

The substrate 11 may include, for example, glass or resin low in permeability to moisture and oxygen, or may include a semiconductor with which a transistor or the like is formed easily. Specifically, the substrate 11 may be, for example, a glass substrate such as high strain point glass, soda glass, borosilicate glass, forsterite, lead glass, or quartz glass; a semiconductor substrate such as amorphous silicon or polycrystalline silicon; or a resin substrate such as polymethyl methacrylate, polyvinyl alcohol, polyvinyl phenol, polyether sulfone, polyimide, polycarbonate, polyethylene terephthalate, or polyethylene naphthalate.

(Light Emitting Element 12)

The plurality of light emitting elements 12 is provided on the one main face of the substrate 11 in the effective display region R1. The plurality of light emitting elements 12 is disposed in a matrix on the one main face of the substrate 11. The light emitting elements 12 are each a white OLED, and as a coloring method in the display device 10, a method using such a white OLED and a color filter 15 is used. Note that the coloring method is not limited thereto, and an RGB coloring method or the like may be used. Alternatively, a monochromatic filter may be used. Alternatively, the light emitting elements 12 may be each a Micro-OLED (MOLED) or a Micro-LED.

The light emitting elements 12 each include, a first electrode 12A, for example, as an anode; an organic layer 12B; and, a second electrode 12C, for example, as a cathode are stacked in this order from the substrate 11 side.

(First Electrode 12A)

The first electrode 12A is provided on the one main face of the substrate 11 in the effective display region R1. The first electrode 12A is electrically separated for each pixel. The first electrode 12A also functions as a reflection layer, and preferably includes a metal layer having as high in reflectance as possible and a large work function in order to enhance light emission efficiency. Examples of the constituent material of the metal layer include at least one of a simple substance and an alloy of metal elements such as chromium (Cr), gold (Au), platinum (Pt), nickel (Ni), copper (Cu), molybdenum (Mo), titanium (Ti), tantalum (Ta), aluminum (Al), magnesium (Mg), iron (Fe), tungsten (W), and silver (Ag). Specific examples of the alloy include an AlNi alloy and an AlCu alloy. The first electrode 12A may include a layered film of a plurality of metal layers containing at least one of a simple substance and an alloy of the above metal elements.

(Second Electrode 12C)

The second electrode 12C is provided facing the first electrode 12A with the organic layer 12B interposed therebetween. The second electrode 12C is provided as an electrode common to all the pixels within the effective display region R1, and has a peripheral portion extending outward from the effective display region R1 (i.e., to the peripheral region R2). The second electrode 12C is a transparent electrode having transmissivity to light generated from the organic layer 12B. Here, the transparent electrode also includes a semi-transmissive reflection layer. The second electrode 12C is made of, for example, metal or metal oxide. Examples of the metal include at least one of a simple substance and an alloy of metal elements such as aluminum (Al), magnesium (Mg), calcium (Ca), and sodium (Na). As the alloy, for example, an alloy (MgAg alloy) of magnesium (Mg) and silver (Ag) or an alloy (AlLi alloy) of aluminum (Al) and lithium (Li) is suitable. Examples of the metal oxide include a mixture of indium oxide and tin oxide (ITO), a mixture of indium oxide and zinc oxide (IZO), and zinc oxide (ZnO).

(Organic Layer 12B)

Figure 2:
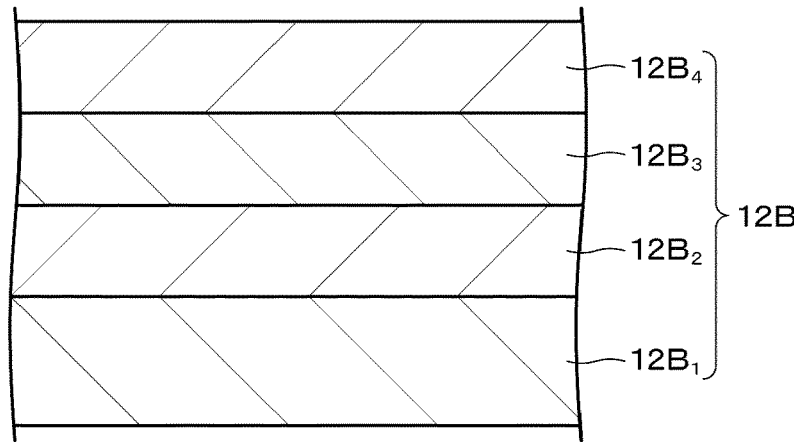
FIG. 2 is an enlarged sectional view illustrating an exemplary configuration of an organic layer illustrated in FIG. 1B.
Figure 3:
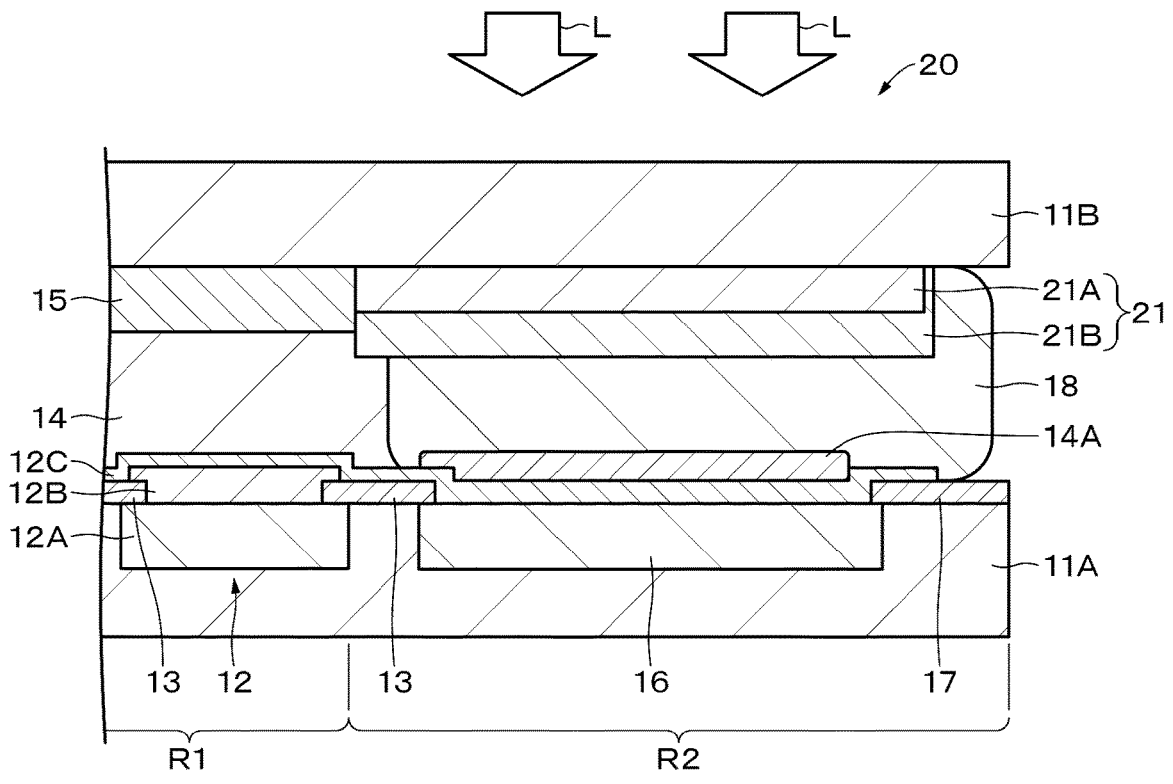
FIG. 3 is a sectional view illustrating a configuration of a display device according to a reference example.

The organic layer 12B is provided between the first electrode 12A and the second electrode 12C. The organic layer 12B is provided as an organic layer common to all the pixels within the effective display region R1. FIG. 3 illustrates the organic layer 12B in FIG. 2 in an enlarged manner. The organic layer 12B includes a hole injection layer $12B_1$, a hole transport layer $12B_2$, a light emitting layer $12B_3$, and an electron transport layer $12B_4$ are layered in this order from the first electrode 12A side. Note that the configuration of the organic layer 12B is not limited thereto, and the layers other than the light emitting layer $12B_3$ are provided as necessary.

The hole injection layer $12B_1$ is a buffer layer for enhancing hole injection efficiency to the light emitting layer $12B_3$ and suppressing leakage. The hole transport layer $12B_2$ is for enhancing hole transport efficiency to the light emitting layer $12B_3$. The light emitting layer $12B_3$ generates light resulting from recombination of electrons and holes due to application of an electric field. The electron transport layer $12B_4$ is for enhancing electron transport efficiency to the light emitting layer $12B_3$. An electron injection layer (not illustrated) may be provided between the electron transport layer $12B_4$ and the second electrode 12C. The electron injection layer is for enhancing electron injection efficiency.

(Insulating Layer 13)

The insulating layer 13 is provided on the one main face of the substrate 11 in the effective display region R1. The insulating layer 13 is provided between each of the light emitting elements 12 and electrically separates the first electrode 12A for each pixel. The insulating layer 13 has an opening in a portion corresponding to each of the first electrodes 12A. Specifically, the insulating layer 13 is provided between each of the first electrodes 12A and covers the peripheral portion of each of the first electrodes 12A.

The insulating layer 13 includes, for example, an organic material or an inorganic material. Examples of the organic material include polyimide and acrylic resin. Examples of the inorganic material include silicon oxide, silicon nitride, silicon oxynitride, and aluminum oxide.

(Protective Layer 14)

The protective layer 14 is provided on the plurality of light emitting elements 12. The protective layer 14 is for protecting the light emitting elements 12. For example, the protective layer 14 is for blocking the light emitting elements 12 from the outside air and for suppressing moisture infiltration into the light emitting elements 12 from the external environment.

The protective layer 14 includes, for example, a filler. The filler contains, for example, an ultraviolet-light curable resin.

(Color Filter 15)

The color filter 15 is provided on the protective layer 14. As the color filter 15, for example, respective color filters of a red filter, a green filter, and a blue filter are included. The red filter, the green filter, and the blue filter are arranged in a prescribed pattern in an in-plane direction of display device 10. The color filter 15 is provided facing the light emitting elements 12. With this arrangement, white light emitted from each light emitting element 12 passes through the color filter 15, so that, for example, red light, green light, and blue light are each emitted from the display face. Further, a light blocking layer (not illustrated) may be provided between each of the color filters, that is, in a region between each of the pixels.

(Contact Portion 16)

The contact portion 16 is provided on the one main face of the substrate 11 in the peripheral region R2. The contact portion 16 is connected to the peripheral portion of the second electrode 12C. The contact portion 16 is an exemplary metal layer provided outside the effective display region R1 (i.e., in the peripheral region R2). Examples of the material of the contact portion 16 include a material similar to that of the first electrode 12A. From the viewpoint of reducing the contact resistance between the peripheral portion of the second electrode 12C and the contact portion 16, the contact portion 16 is preferably tabular in shape. Specifically, the contact portion 16 is preferably a solid electrode.

(Sealant 18)

The sealant 18 bonds the peripheral portion of the facing face of the substrate 11A and the peripheral portion of the facing face of the counter substrate 11B. The sealant 18 is provided between the filter-layered body 19 and the contact portion 16, more specifically, between the filter-layered body 19 and the peripheral portion of the second electrode 12C. As a material of the sealant 18, for example, a thermosetting resin can be used.

(Filler 14A)

The filler 14A is provided between the contact portion 16 and the sealant 18, more specifically, between the second electrode 12C and the sealant 18. In the manufacturing process of the display device 10, in application of a filler for forming the protective layer to the effective display region R1 on the substrate 11, the filler 14A unintentionally enters between the second electrode 12C and the sealant 18 in the peripheral region R2. Thus, the filler 14A contains a material similar to that of the protective layer 14.

(Filter-Layered Body 19)

The filter-layered body 19 is provided facing the contact portion 16. The filter-layered body 19 is provided on the sealant 18. The filter-layered body 19 has a function as a light blocking layer that blocks external light (visible light). The filter-layered body 19 is provided in the peripheral region R2, which can suppress external light from entering the display device 10 in the peripheral region R2. Thus, reflection of external light by the metal layer such as the contact portion 16 can be suppressed.

The filter-layered body 19 includes a first color filter 19A and a second color filter 19B. The first color filter 19A and the second color filter 19B may be different or the same in color. FIG. 1B exemplifies the first color filter 19A provided on the counter substrate 11B side and the second color filter 19B provided on the substrate 11A side. Inversely, the first color filter 19A may be disposed on the substrate 11A side and the second color filter 19B may be disposed on the counter substrate 11B.

The first color filter 19A allows ultraviolet light to pass therethrough and can blocks light having a specific wavelength emphasized by the resonator structure 16A. The first color filter 19A is, for example, a red filter, a blue filter, or a green filter, and among these filters, a red filter is particularly preferable. Because the red filter has a high transmittance of ultraviolet light, which can particularly suppress the filler 14A to be uncured.

The second color filter 19B has one or more holes 19C. Such a hole 19C is for allowing ultraviolet light to pass therethrough and irradiating the filler 14A with the ultraviolet light. The second color filter 19B has the one or more holes 19C and the transmittance of ultraviolet light in the filter-layered body 19 is improved, which can suppress the filler 14A to be uncured.

Examples of the shape of such a hole 19C include a slit shape, a circular shape, an elliptical shape, and a polygonal shape. Here, the "shape of such a hole 19C" means a shape when the hole 19C is viewed from a direction perpendicular to the display face of the display device 10. The plurality of holes 19C may be provided in a regular pattern or may be provided randomly. The second color filter 19B is, for example, a red filter, a blue filter, or a green filter.

(Resonator Structure 16A)

The resonator structure 16A resonates light reflected by the contact portion 16 and extracts light in a specific wavelength range. The resonator structure 16A is provided facing the holes 19C of the second color filter 19B. This arrangement allows the light in the specific wavelength range extracted by the resonator structure 16A to enter the first color filter 19A through the holes 19C. In a case where the second color filter 19B has two or more holes 19C, the resonator structure 16A may be provided corresponding to each of the two or more holes 19C, or a single resonator structure 16A may be provided in common for the two or more holes 19C.

(Optical Adjustment Layer 17)

The optical adjustment layer 17 is provided between the contact portion 16 and the second electrode 12C, and adjusts the distance between the contact portion 16 and the second electrode 12C. The distance between the contact portion 16 and the second electrode 12C is adjusted to a specified distance on the basis of the thickness of the optical adjustment layer 17. The distance between the contact portion 16 and the second electrode 12C is adjusted to the specified distance in such a manner, resulting in extraction of light in a specific wavelength range by the resonator structure 16A.

The optical adjustment layer 17 is, for example, an insulating layer. Hereinafter, in order to distinguish the insulating layer as the optical adjustment layer 17 from the insulating layer 13, the insulating layer as the optical adjustment layer 17 is referred to as an optical-adjustment insulating layer. The optical-adjustment insulating layer may be the same in configuration as the insulating layer 13 or may be different in configuration from the insulating layer 13. In a case where the optical-adjustment insulating layer is the same in configuration as the insulating layer 13, the optical-adjustment insulating layer and the insulating layer 13 can be simultaneously formed, so that the manufacturing process can be simplified. In a case where the optical-adjustment insulating layer is different in configuration from the insulating layer 13, the insulating layer 13 and the optical-adjustment insulating layer may be different in at least one of thickness, material, and layered configuration. In this case, in accordance with light in a specific wavelength range desired to be extracted by the resonator structure 16A, at least one of the thickness, material, and layered configuration of the optical-adjustment insulating layer can be set independently of the insulating layer 13. Examples of a material of the optical-adjustment insulating layer include an inorganic insulating material and an organic resin material. As the inorganic insulating material, a material similar to that of the insulating layer 13 can be exemplified. Examples of the organic resin material include an acrylic resin and a polyimide resin.

(Counter Substrate 11B)

The counter substrate 11B is provided on the color filter 15. The counter substrate 11B is provided such that the one main face of the counter substrate 11B faces the one main face of the substrate 11 provided with the plurality of light emitting elements 12. The counter substrate 11B is for sealing, for example, the light emitting elements 12, the protective layer 14, and the color filter 15. The counter substrate 11B includes a material such as glass transparent to each color of light emitted from the color filter 15.

(Pad Portion 11C)

The pad portion 11C is a connecting portion for connecting to, for example, an electronic apparatus. The pad portion 11C is connected to, for example, the main board of the electronic apparatus through a flexible printed wiring board or the like.

2 Method for Manufacturing Display Device

Hereinafter, a method for manufacturing a display device 10 having such a configuration as described above will be described.

First, a drive circuit and others are formed on one main face of a substrate 11 in an effective display region R1 using, for example, a thin film forming technique, a photolithography technique, and an etching technique. Next, a metal layer is formed on the drive circuit and the others by, for example, a sputtering method. Then, the metal layer is patterned by, for example, a photolithography technique and an etching technique to form a plurality of first electrodes 12A separated for each light emitting element 12 (i.e., for each pixel).

Next, an insulating layer 13 is formed by, for example, a chemical vapor deposition (CVD) method, and then the insulating layer 13 is patterned using a photolithography technique and an etching technique. Next, an optical adjustment layer 17 is formed by, for example, a CVD method, and then the optical adjustment layer 17 is patterned using a photolithography technique and an etching technique. Note that the method for forming the insulating layer 13 and the optical adjustment layer 17 is not limited thereto, and thus, for example, an insulating layer 13 and an optical adjustment layer 17 may be formed simultaneously, and then the insulating layer 13 and the optical adjustment layer 17 may be patterned simultaneously.

Next, a hole injection layer $12B_1$, a hole transport layer $12B_2$, a light emitting layer $12B_3$, and an electron transport layer $12B_4$ are layered in this order on the first electrodes 12A and the insulating layer 13 by, for example, a vapor deposition method using a mask, thereby forming an organic layer 12B. Next, a second electrode 12C is formed on the organic layer 12B by, for example, a sputtering method. As a result, the plurality of light emitting elements 12 is formed on the one main face of the substrate 11.

Next, a filler is applied by, for example, one drop fill (ODF) method. That is, on the substrate 11 in a peripheral region R2, a sealant 18 is applied in a closed loop shape so as to surround the effective display region R1 to form a frame, and then the filler is applied to the inside of the frame. At this time, the filler may enter between the second electrode 12C and the sealant 18. Next, a counter substrate 11B with a color filter 15 formed in advance in the effective display region R1 and a filter-layered body 19 formed in advance in the peripheral region R2 is prepared, and then the counter substrate 11B is placed on the filler. Next, after the sealant 18 is hardened by heat treatment, the filler is cured by irradiating the effective display region R1 and the peripheral region R2 of the counter substrate 11B with ultraviolet light L. As a result, the substrate 11A and the counter substrate 11B are bonded together. In addition, the filler is cured, so that a protective layer 14 is formed on the plurality of light emitting elements 12. As described above, the display device 10 illustrated in FIGS. 1A and 1B is obtained.

3 Actions and Effects

As described above, in the display device 10 according to the embodiment, the contact portion 16 is provided outside the effective display region R1, that is, in the peripheral region R2, and the filter-layered body 19 is provided facing the contact portion 16. This arrangement enables blocking of external light having entered the peripheral region R2 of the display face. Therefore, reflection of external light by the contact portion 16 can be suppressed.

In the display device 10 according to the embodiment, the filter-layered body 19 includes the first color filter 19A and the second color filter 19B having the one or more holes 19C. In the manufacturing process of display device 10, this arrangement allows a sufficient amount of ultraviolet light to reach the filler 14A through the holes 19C of the second color filter 19B. Therefore, even if the filter-layered body 19 is provided in the peripheral region R2, the filler 14A can be suppressed from being uncured. As a result, even if the filter-layered body 19 is provided in the peripheral region R2, a decrease in reliability can be suppressed.

The display device 10 according to the embodiment includes the resonator structure 16A including the second electrode 12C and the contact portion 16. The resonator structure 16A resonates light reflected by the contact portion 16 and extracts light in a specific wavelength range. Then, the first color filter 19A blocks the light in the specific wavelength range extracted by the resonator structure 16A. In a case where the second color filter 19B is provided with one or more holes 19C, it is likely that the light-blocking property of the filter-layered body 19 is decreased. Such a decrease in the light-blocking property, however, can be compensated by the resonator structure 16A.

FIG. 3 is a sectional view illustrating a configuration of a display device 20 of a reference example. The display device 20 includes a filter-layered body 21. The filter-layered body 21 includes a first color filter 21A and a second color filter 21B that both have no holes. Thus, it is difficult to allow a sufficient amount of ultraviolet light L to reach a filler 14A having entered a peripheral region R2. As a result, the filler 14A is uncured, and the reliability is decreased.

4 Modified Examples

Modified Example 1

In the above embodiment, described has been the case where the display device 10 includes the resonator structure 16A in the peripheral region R2. A resonator structure 16A may not be provided in a peripheral region R2. In this case, a display device 10 may not include an optical adjustment layer 17 in the peripheral region R2.

Modified Example 2

In the above embodiment, given has been the example in which the metal layer provided outside the effective display region R1 (i.e., in the peripheral region R2) is the contact portion (e.g., cathode contact portion) 16, but the metal layer is not limited thereto. For example, such a metal layer as described above may be wiring or the like provided outside an effective display region R1. In this case, a resonator structure may be formed by a second electrode 12C and the metal layer such as wiring.

Modified Example 3

In the above embodiment, given has been the example in which the filter-layered body 19 includes two color filters of the first color filter 19A and the second color filter 19B. A filter-layered body 19, however, may include three or more color filters. In this case, at least one of the three or more color filters is a filter having no holes for allowing ultraviolet light to pass therethrough.

5 Applications (Electronic Apparatus)

The display device 10 according to any of the above embodiment and the modified examples thereof may be provided in various electronic apparatuses. In particular, the display device 10 is preferably provided in an electronic view finder of a video camera or a single-lens reflex camera, or a head-mounted display that requires high resolution and is enlarged and used near eyes.

Specific Example 1

Figure 4A:
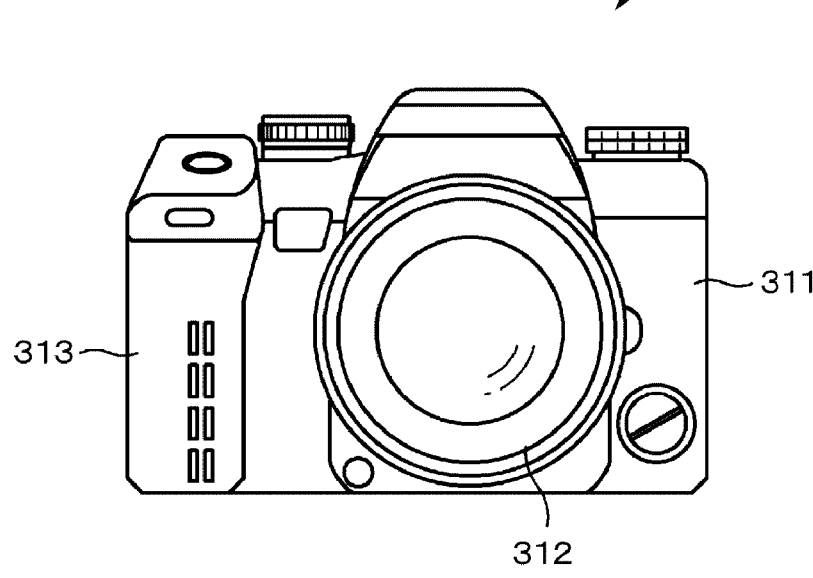
FIG. 4A is a front view illustrating an exemplary external appearance of a digital still camera.
Figure 4B:
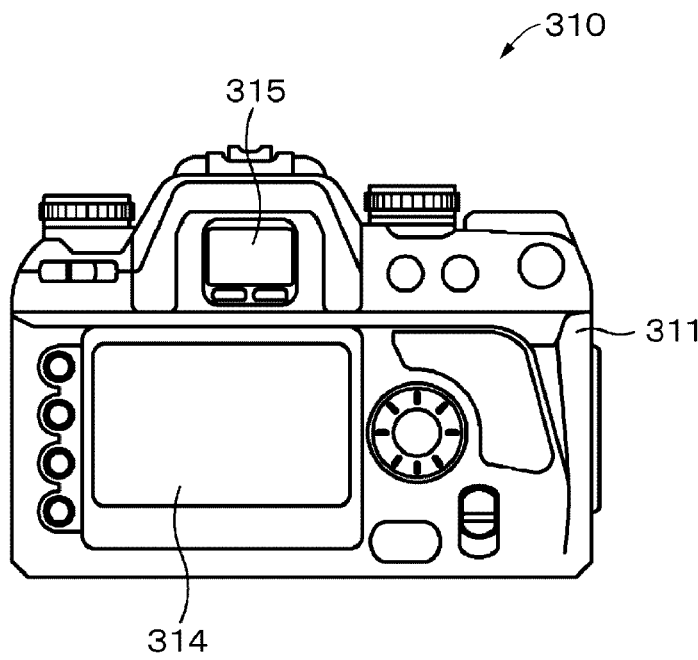
FIG. 4B is a rear view illustrating the exemplary external appearance of the digital still camera.

FIGS. 4A and 4B each illustrate an exemplary external appearance of a digital still camera 310. The digital still camera 310 is of a lens-interchangeable single-lens reflex type, and includes an interchangeable shooting lens unit (interchangeable lens) 312 at substantially the center of the front of a camera body portion (camera body) 311, and a grip portion 313 to be held by a shooter on the left of the front.

A monitor 314 is provided at a position deviating from the center of the rear of the camera body portion 311 to the left. An electronic view finder (eyepiece window) 315 is provided above the monitor 314. While looking into the electronic view finder 315, the shooter can determine the composition by visually recognizing the optical image of a subject guided from the shooting lens unit 312. As the electronic view finder 315, the display device 10 according to any of the above embodiment and the modified examples thereof can be used.

Specific Example 2

Figure 5:
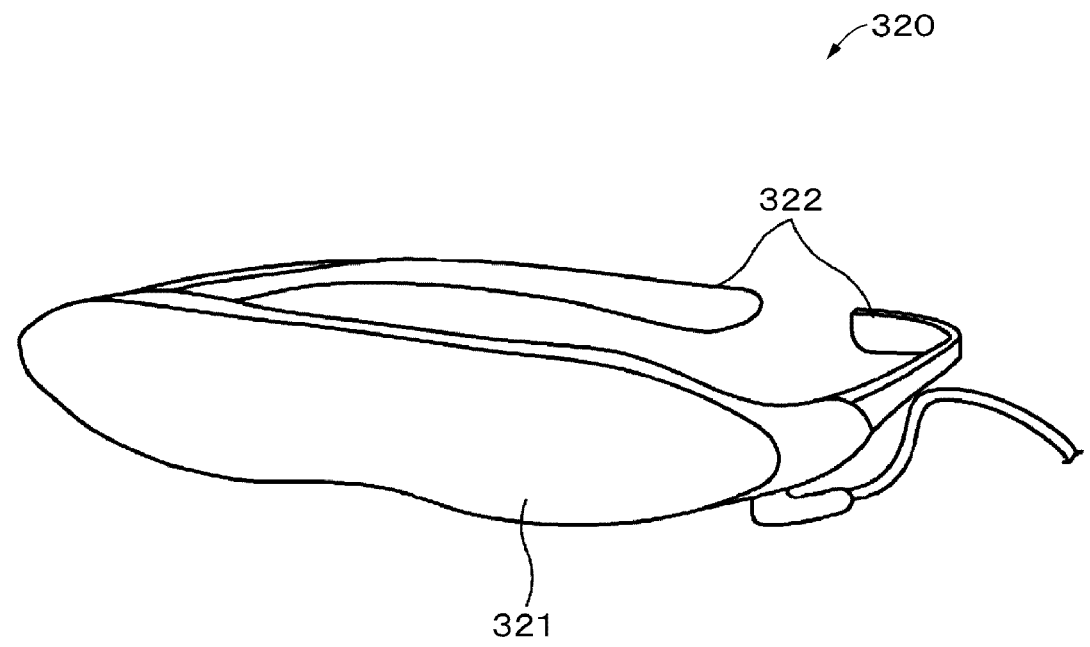
FIG. 5 is a perspective view illustrating an exemplary external appearance of a head-mounted display.

FIG. 5 illustrates an exemplary external appearance of a head-mounted display 320. The head-mounted display 320 includes, for example, respective hooking portion 322 to be worn on the head of the user on both sides of an eyeglass-shaped display unit 321. As the display unit 321, the display device 10 according to any of the above embodiment and the modified examples thereof can be used.

Specific Example 3

Figure 6:
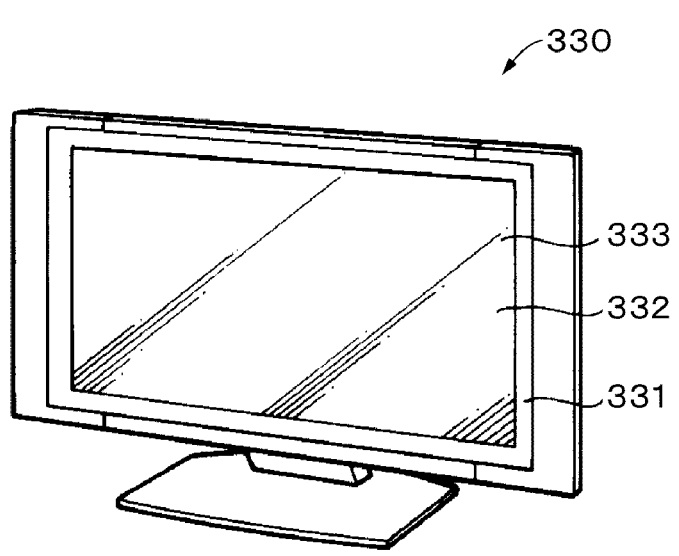
FIG. 6 is a perspective view illustrating an exemplary external appearance of a television device.

FIG. 6 illustrates an exemplary external appearance of a television device 330. The television device 330 includes, for example, a video-image display screen unit 331 including a front panel 332 and a filter glass 333. The video-image display screen unit 331 includes the display device 10 according to any of the above embodiment and the modified examples thereof.

Example

The present disclosure will be specifically described below with reference to Example; however, the present disclosure is not limited thereto.

Example 1

Figure 7:
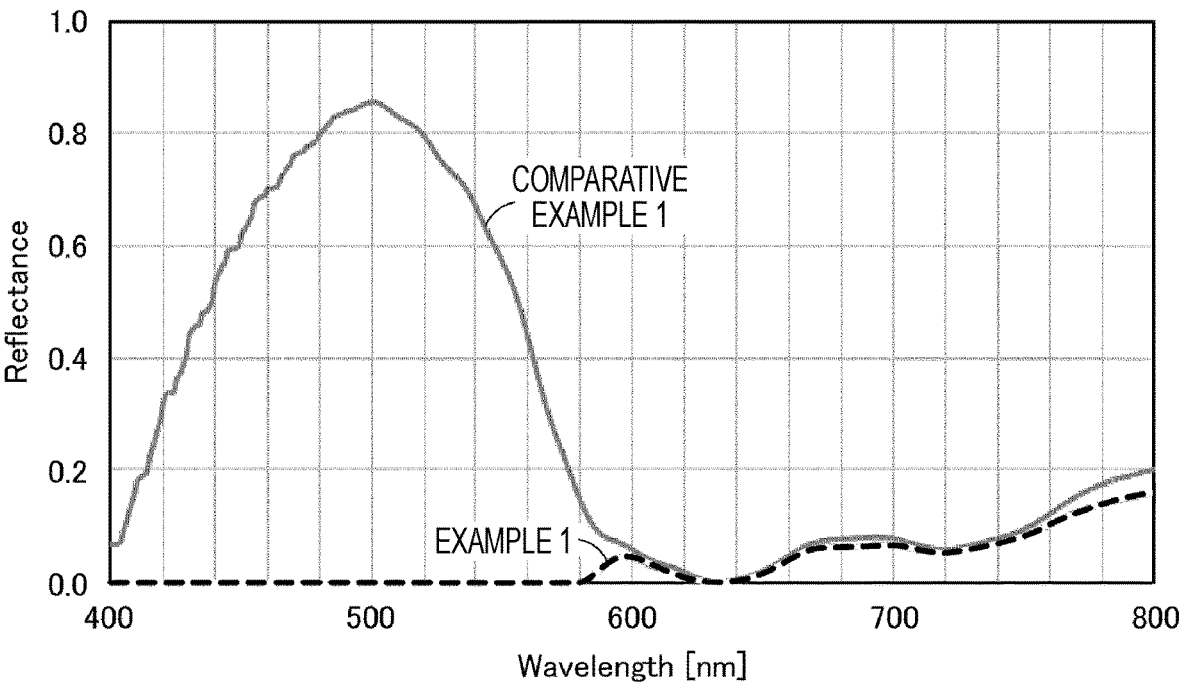
FIG. 7 is a graph indicating a reflection spectrum of a peripheral region of each display device.

A display device having such a configuration as illustrated in FIG. 1B was set as a model of simulation. A first color filter and a second color filter were a red color filter without a hole and a blue color filter with a hole, respectively. Reflectance when external light entered a peripheral region of a display face in the display device was obtained by the simulation. FIG. 7 shows the result.

Comparative Example 1

A model of simulation similar to that of Example 1 was set except that a filter-layered body was not provided. Reflectance when external light entered a peripheral region of a display face in the display device was obtained by the simulation. FIG. 7 shows the result.

The following can be found from FIG. 7.

In the display device without a filter-layered body (Comparative Example 1), light in a short wavelength range (about 400 nm to 580 nm) is extracted by a resonator structure, so that the reflectance in the short wavelength range is higher.

On the other hand, in the display device with the filter-layered body, light in a short wavelength range (about 400 nm to 580 nm) extracted by the resonator structure is blocked by the second color filter (red color filter), so that the reflectance in the short wavelength range is lower.

The embodiment of the present disclosure and the modified examples thereof have been specifically described above. The present disclosure, however, is not limited to the above embodiment and the modified examples thereof, and thus various modifications based on the technical idea of the present disclosure can be made.

For example, the configurations, methods, processes, shapes, materials, numeric values, and others described in the above embodiment and the modified examples thereof are merely examples, and configurations, methods, processes, shapes, materials, numeric values, and others different from those described in the above embodiment and the modified examples thereof may be used as necessary.

The configurations, methods, processes, shapes, materials, numeric values, and the others of the above embodiment and the modified examples thereof can be combined with each other, without departing from the gist of the present disclosure.

The materials exemplified in the above embodiment and the modified examples thereof can be used alone or in combination of two or more unless otherwise specified.

Further, the present disclosure can also adopt the following configurations.

(1)

A display device including:

a metal layer provided outside an effective display region; and a filter-layered body provided facing the metal layer, in which the filter-layered body includes a first color filter and a second color filter having a hole.

(2)

The display device according to (1), further including:

an electrode extending outward from the effective display region, in which the electrode and the metal layer are included in a resonator structure.

(3)

The display device according to (2), in which the resonator structure resonates light reflected by the metal layer and extracts light in a specific wavelength range, and the first color filter blocks the light in the specific wavelength range extracted by the resonator structure.

(4)

The display device according to (2) or (3), further including: an optical adjustment layer provided between the metal layer and the electrode.

(5)

The display device according to (4), in which the optical adjustment layer corresponds to an insulating layer.

(6)

The display device according to (2) or (3), further including:

a plurality of light emitting elements provided in the effective display region;

a first insulting layer provided between each of the plurality of light emitting elements; and a second insulating layer provided between the metal layer and the electrode, in which the first insulating layer and the second insulating layer are different in at least one of thickness, material, and layered configuration.

(7)

The display device according to (1), further including:

an electrode extending outward from the effective display region, in which the metal layer corresponds to a contact portion connected to a peripheral portion of the electrode.

(8)

The display device according to (1), in which the metal layer corresponds to wiring.

(9)

The display device according to any of (1) to (8), further including:

a sealant provided between the filter-layered body and the metal layer; and a filler provided between the metal layer and the sealant, in which the filler contains an ultraviolet-light curable resin.

(10)

The display device according to any of (1) to (9), in which the first color filter allows ultraviolet light to pass through the first color filter.

(11)

The display device according to any of (1) to (10), in which the first color filter corresponds to a red filter.

(12)

The display device according to any of (1) to (11), in which the metal layer is tabular in shape.

(13)

An electronic apparatus including: the display device according to any of (1) to (12).

REFERENCE SIGNS LIST

10 Display device
11A Substrate
11B Counter substrate
11C Pad portion
12 Light emitting element
12A First electrode
12B Organic layer
$12B_1$ Hole injection layer
$12B_2$ Hole transport layer
$12B_3$ Light emitting layer
$12B_4$ Electron transport layer
12C Second electrode
13 Insulating layer
14 Protective layer
14A Filler
15 Color filter
16 Contact portion
17 Optical adjustment layer
18 Sealant
19 Filter-layered body
19A First color filter
19B Second color filter
R1 Effective display region
R2 Peripheral region

The invention claimed is:

1. A display device, comprising:

a metal layer outside an effective display region;

an electrode which extends outward from the effective display region, wherein the metal layer corresponds to a contact portion connected to a peripheral portion of the electrode; and a filter-layered body which faces the metal layer, wherein the filter-layered body includes a first color filter and a second color filter, and the second color filter has a hole.

2. The display device according to claim 1, wherein the electrode and the metal layer are included in a resonator structure.

3. The display device according to claim 2, wherein the resonator structure resonates light reflected by the metal layer and extracts light in a specific wavelength range, and the first color filter blocks the light in the specific wavelength range extracted by the resonator structure.

4. The display device according to claim 2, further comprising an optical adjustment layer between the metal layer and the electrode.

5. The display device according to claim 4, wherein the optical adjustment layer corresponds to an insulating layer.

6. The display device according to claim 2, further comprising:

a plurality of light emitting elements in the effective display region;

a first insulting layer between each of the plurality of light emitting elements; and a second insulating layer between the metal layer and the electrode, wherein the first insulating layer and the second insulating layer are different in at least one of thickness, material, and layered configuration.

7. The display device according to claim 1, further comprising:

a sealant between the filter-layered body and the metal layer; and a filler between the metal layer and the sealant, wherein the filler contains an ultraviolet-light curable resin.

8. The display device according to claim 1, wherein the first color filter is configured to allow ultraviolet light to pass through the first color filter.

9. The display device according to claim 1, wherein the first color filter corresponds to a red filter.

10. The display device according to claim 1, wherein the metal layer is tabular in shape.

11. An electronic apparatus, comprising:

a display device which comprises:

a metal layer outside an effective display region;

an electrode which extends outward from the effective display region, wherein the metal layer corresponds to a contact portion connected to a peripheral portion of the electrode; and a filter-layered body which faces the metal layer, wherein the filter-layered body includes a first color filter and a second color filter, and the second color filter has a hole.

\* \* \* \* \*